(12) United States Patent
Petrmichl

(10) Patent No.: US 6,359,388 B1
(45) Date of Patent: Mar. 19, 2002

(54) COLD CATHODE ION BEAM DEPOSITION APPARATUS WITH SEGREGATED GAS FLOW

(75) Inventor: Rudolph Hugo Petrmichl, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

(21) Appl. No.: 09/649,010

(22) Filed: Aug. 28, 2000

(51) Int. Cl.[7] .................................................. H01J 7/24
(52) U.S. Cl. ................................ 315/111.81; 250/423 R
(58) Field of Search ........................ 315/111.81, 111.31, 315/111.41, 111.91; 204/192.11, 192.12, 298.02, 298.08, 298.33; 250/423 R, 424, 423 F

(56) References Cited

U.S. PATENT DOCUMENTS

| | | | |
|---|---|---|---|
| 2,672,560 A | 3/1954 | Berry ........................ 250/41.9 |
| 3,984,692 A | 10/1976 | Arsenault ................ 250/423 R |
| 4,122,347 A | 10/1978 | Kovalsky et al. ........ 250/423 R |
| 4,303,865 A | 12/1981 | Swingler ................ 250/423 R |
| 4,401,539 A | 8/1983 | Abe et al. ................ 204/192 R |
| 4,434,038 A | 2/1984 | Morrison, Jr. ........... 204/192 R |
| 4,569,746 A | 2/1986 | Hutchinson ................. 204/298 |
| 4,572,776 A | 2/1986 | Aichert et al. .............. 204/298 |
| 4,595,482 A | 6/1986 | Mintz ........................ 204/298 |
| 4,606,806 A | 8/1986 | Helmer ....................... 204/298 |
| 4,652,795 A | 3/1987 | Lee et al. ................. 315/111.41 |
| 4,657,654 A | 4/1987 | Mintz ........................ 204/298 |
| 4,661,228 A | 4/1987 | Mintz ..................... 204/192.25 |
| 4,677,904 A | 7/1987 | Natsumeda et al. .......... 98/38.1 |
| 4,710,283 A | 12/1987 | Singh et al. ................. 204/298 |
| 4,865,710 A | 9/1989 | Aaron et al. ............ 204/192.12 |
| 4,865,712 A | 9/1989 | Mintz .......................... 204/298 |
| 4,957,605 A | 9/1990 | Hurwitt et al. ......... 204/192.12 |
| 5,106,470 A | 4/1992 | Takei et al. ............. 204/192.12 |
| 5,130,607 A | 7/1992 | Lama ...................... 315/111.81 |
| 5,407,551 A | 4/1995 | Sieck et al. ............ 204/298.19 |
| 5,415,754 A | 5/1995 | Manley .................. 204/192.12 |
| 5,508,368 A | 4/1996 | Knapp et al. ................ 427/534 |
| 5,656,819 A | 8/1997 | Greenly .................. 250/423 R |
| 5,736,019 A | 4/1998 | Bernick ................. 204/298.07 |
| 5,865,961 A | 2/1999 | Yokoyama et al. ..... 204/192.12 |
| 5,888,593 A | 3/1999 | Petrmichl et al. ........... 427/563 |
| 5,889,371 A | 3/1999 | Boyarsky et al. ........ 315/111.81 |
| 5,973,447 A | 10/1999 | Mahoney et al. ......... 313/359.1 |
| 6,002,208 A | 12/1999 | Maishev et al. ........ 315/111.91 |
| 6,037,717 A | 3/2000 | Maishev et al. ........ 315/111.91 |
| 6,147,354 A | * 11/2000 | Maishev et al. ........ 250/423 R |
| 6,153,067 A | * 11/2000 | Maishev et al. ........ 204/298.04 |
| 6,238,526 B1 | * 5/2001 | Maishev et al. ........ 204/192.11 |
| 6,246,059 B1 | * 6/2001 | Maishev et al. ............ 250/426 |
| 6,261,424 B1 | 7/2001 | Goncharenko et al. 204/192.38 |

* cited by examiner

Primary Examiner—Don Wong
Assistant Examiner—Thuy Vinh Tran
(74) Attorney, Agent, or Firm—Nixon & Vanderhye P.C.

(57) ABSTRACT

A cold cathode closed drift ion source is provided with segregated gas flow. A first gas may be caused to flow through or along a path around a peripheral portion of an anode so as to pass through the electric gap between the anode and cathode. A second gas (different from the first gas) may be caused to flow toward the ion emitting slit, without much of the second gas having to pass through the electric gap(s). If it is desired to utilize a gas which produces insulative material (e.g., an organosilicon gas), this gas may be used as the second gas. Accordingly, insulative material buildup in the electric gap between the anode and cathode may be reduced, and changes in beam chemistry can be achieved without unduly altering ion beam characteristics.

16 Claims, 6 Drawing Sheets

COLD CATHODE ION BEAM DEPOSITION APPARATUS WITH SEGREGATED GAS FLOW

This invention relates to a cold cathode ion beam deposition apparatus with segregated gas flow, and corresponding method. More particularly, this invention relates to a cold cathode ion beam deposition apparatus wherein different gases are caused to flow through different flow channels toward an area of energetic electrons in order to provide a more efficient ion beam deposition apparatus and corresponding method.

BACKGROUND OF THE INVENTION

An ion source is a device that causes gas molecules to be ionized and then focuses, accelerates, and emits the ionized gas molecules and/or atoms in a beam toward a substrate. Such an ion beam may be used for various technical and technological purposes, including but not limited to, cleaning, activation, polishing, etching, and/or deposition of thin film coatings. Exemplary ion sources are disclosed, for example, in U.S. Pat. Nos. 6,037,717; 6,002,208; and 5,656,819, the disclosures of which are all hereby incorporated herein by reference.

FIGS. 1 and 2 illustrate a conventional ion source. In particular, FIG. 1 is a side cross-sectional view of an ion beam source with a circular ion beam emitting slit, and FIG. 2 is a corresponding sectional plan view along section line II—II of FIG. 1.

FIG. 3 is a sectional plan view similar to FIG. 2, for purposes of illustrating that the FIG. 1 ion beam source may have an oval ion beam emitting slit as opposed to a circular ion beam emitting slit.

Referring to FIGS. 1–3, the ion source includes hollow housing 3 made of a magnetoconductive material such as mild steel, which is used as a cathode 5. Cathode 5 includes cylindrical or oval side wall 7, a closed or partially closed bottom wall 9, and an approximately flat top wall 11 in which a circular or oval ion emitting slit 15 is defined. Ion emitting slit 15 includes an inner periphery 17 as well as an outer periphery 19.

Working gas supply aperture or hole 21 is formed in bottom wall 9. Flat top wall 11 functions as an accelerating electrode. A magnetic system in the form of a cylindrical permanent magnet 23 with poles N and S of opposite polarity is placed inside housing 3 between bottom wall 9 and top wall 11. The N-pole faces flat top wall 11, while the S-pole faces bottom wall 9 of the ion source. The purpose of the magnetic system, including magnet 23 with a closed magnetic circuit formed by the magnet 23, cathode 5, side wall(s) 7, and bottom wall 9, is to induce a substantially transverse magnetic field (MF) in an area proximate ion emitting slit 15.

A circular or oval shaped anode 25, electrically connected to positive pole 27 of electric power source 29, is arranged in the interior of housing 3 so as to at least partially surround magnet 23 and be approximately concentric therewith. Anode 25 may be fixed inside the housing by way of ring 31 (e.g., of ceramic). Anode 25 defines a central opening 33 therein in which magnet 23 is located. Negative pole 35 of electric power source 29 is connected to housing 3 (and thus to cathode 5) generally at 37, so that the cathode and housing are grounded (GR).

Located above housing 3 (and thus above cathode 5) of the ion source of FIGS. 1–3 is vacuum chamber 41. Chamber 41 includes evacuation port 43 that is connected to a source of vacuum (not shown). An object or substrate 45 to be treated (e.g., coated, etched, cleaned, etc.) is supported within vacuum chamber 41 above ion emitting slit 15 (e.g., by gluing it, fastening it, or otherwise supporting it on an insulator block 47). Thus, substrate 45 can remain electrically and magnetically isolated from the housing of vacuum chamber 41, yet electrically connected via line 49 to negative pole 35 of power source 29. Since the interior of housing 3 can communicate with the interior of vacuum chamber 41, all lines that electrically connect power source 29 with anode 25 and substrate 45 may pass into the interior of housing 3 and/or chamber 41 via conventional electrically feed through devices 51.

The conventional ion beam source of FIGS. 1–3 is intended for the formation of a unilaterally directed tubular ion beam 53, flowing in the direction of arrow 55 toward a surface of substrate 45. Ion beam 53 emitted from the area of slit 15 is in the form of a circle in the FIG. 2 embodiment and in the form of an oval (i.e., race track) in the FIG. 3 embodiment.

The ion beam source of FIGS. 1–3 operates as follows. Vacuum chamber 41 is evacuated, and a working gas 57 is fed into the interior of housing 3 via aperture 21. Power supply 29 is activated and an electric field is generated between anode 25 and cathode 5, which accelerates electrons 59 to high energy. Electron collisions with the working gas in or proximate gap or slit 15 leads to ionization and a plasma is generated. "Plasma" herein means a cloud of gas including ions of a material to be accelerated toward substrate 45. The plasma expands and fills a region including slit 15. An electric field is produced in slit 15, oriented in the direction of arrow 55 (substantially perpendicular to the transverse magnetic field) which causes ions to propagate toward ion substrate 45. Electrons in the ion acceleration space in slit 15 are propelled by the known E x B drift in a closed loop path within the region of crossed electric and magnetic field lines proximate slit 15. These circulating electrons contribute to ionization of the working gas, so that the zone of ionizing collisions extends beyond the electrical gap 63 between the anode and cathode and includes the region proximate slit 15.

For purposes of example, consider the situation where a silane gas 57 is utilized by the ion source of FIGS. 1–3. The silane gas, including the silane inclusive molecules therein, passes through the gap at 63 between anode 25 and cathode 5. Unfortunately, certain of the elements in silane gas are insulative in nature (e.g., silicon carbide may be an insulator in certain applications). Insulating deposits (e.g., silicon carbide) can quickly build up on the respective surfaces of anode 25 and/or cathode 5 proximate gap 63. This can interfere with gas flow through the gap or slit, or alternatively it can adversely affect the electric field potential between the anode and cathode proximate slit 15. In either case, operability and/or efficiency of the ion beam source is adversely affected. In sum, the flow of gas which produces a substantial amount of insulative material buildup in electrical gap 63 on the anode and cathode may be undesirable in certain applications.

Moreover, electrical performance of the ion source is sensitive to parameters of gases within gap 63 (i.e., the electrical gap between the anode 25 and cathode 5). For example, electrical performance of the source is sensitive to characteristics such as the density of the gas within gap 63, the residence time of the gas within gap 63, and/or the molecular weight of the gas within gap 63. Changes in gas chemistry at gap 63 (intentional or unintentional) can alter the characteristics of ion beam 53 (e.g., with regard to energy and/or current density). This problem is particularly troublesome at high total flow conditions where the beam 53 can undergo a significant discontinuous transition between two operational modes (e.g., high energy/low current and low energy/high current).

U.S. Pat. Nos. 5,508,368; 5,888,593; and 5,973,447 relate to ion sources, each of these patents being hereby incorporated herein by reference. Unfortunately, the sources of the '368, '593 and '447 patents primarily relate to thermionic emissive (hot) electron cathodes. This is undesirable, as cold-cathode sources such as that of the instant invention typically operate at higher voltages and/or lower gas flows. These advantages of cold-cathode sources translate into the ability to deposit much harder materials more efficiently (e.g., ta-C versus conventional DLC), and/or the need for fewer or less powerful pump(s). Additional problems with conventional ion sources are discussed in U.S. Pat. No. 6,002,208, in the context of the known Kaufman-type source (e.g., see col. 1 of the '208 patent where it is indicated that such sources are disadvantageous in that they are not suitable for treating large surfaces and/or have low intensity).

In view of the above, it will be apparent to those skilled in the art that there exists a need for an ion source including a more efficient gas flow design.

SUMMARY OF THE INVENTION

An object of this invention is to provide a cold cathode closed drift ion source including a segregated gas flow system.

Another object of this invention is to provide a cold cathode ion source in which a one gas is caused to flow through the electrical gap between the anode and cathode toward an ion emitting slit, and another gas is caused to flow toward the slit but without much of said another gas passing through the electrical gap between the anode and cathode (i.e., preferably less than 50% of said another gas passes through this electrical gap, more preferably less than about 30%, and most preferably less than about 20%).

Another object of this invention is to provide a segregated gas flow arrangement in the context of a cold cathode ion source in order to reduce the likelihood of undesired insulative material buildups in the electrical gap between the anode and cathode.

Yet another object of this invention is to provide an ion source including a first gas flow path and a second gas flow path; wherein the first gas flow path accommodates the flow of a first gas toward the ion emitting slit and the second path accommodates the flow of a second gas (different from the first gas) toward the ion emitting slit.

Another object of this invention is to fulfill any and/or all of the aforesaid objects and/or needs.

Generally speaking, this invention fulfills any one or more of the aforesaid needs and/or objects by providing an ion beam source capable of emitting an ion beam toward a substrate, the ion beam source comprising:

a cathode;

an anode located at least partially between respective portions of said cathode, said anode including an inner periphery and an outer periphery;

an electrical gap defined between said anode and said cathode;

a magnet for generating a magnetic field proximate an ion emitting aperture defined in said cathode, wherein an ion beam is emitted toward a substrate from an area in or proximate said ion emitting aperture;

at least one first gas flow aperture or channel for enabling a first gas to flow around a periphery of the anode and through said electrical gap toward said ion emitting aperture; and at least one second gas flow channel or aperture located within a body of said anode between inner and outer peripheries of said anode, said second gas flow channel or aperture for enabling a second gas to flow through said second gas flow channel or aperture toward said ion emitting aperture.

This invention further fulfills any one or more of the aforesaid needs and/or objects by providing An ion beam source capable of emitting an ion beam toward a substrate, the ion beam source comprising:

an anode and a cathode, with an electrical gap defined between said anode and said cathode;

at least one first gas flow aperture or channel for enabling a first gas to flow through said electrical gap toward an aperture or slit in said cathode; and at least one second gas flow channel or aperture for enabling a second gas to flow through said second gas flow channel or aperture toward said aperture or slit without much of the second gas having to flow through said electrical gap.

Certain embodiments of this invention still further fulfill one or more of the aforesaid needs and/or objects by providing a method of emitting an ion beam toward a substrate, the method comprising the steps of:

providing an ion beam source including an anode and a cathode, so that an electrical gap is provided between the anode and cathode;

causing a first gas to flow through a first flow area around a periphery of the anode and through the electrical gap toward an aperture or slit defined in the cathode;

causing a second gas to flow through a second gas flow channel or aperture defined in a body of the anode and toward the aperture or slit in the cathode; and ionizing at least a portion of at least one of the first and second gases proximate the aperture or slit in the cathode and causing an ion beam to be directed from the aperture or slit in the cathode toward the substrate.

DETAILED DESCRIPTION OF THE EXEMPLARY EMBODIMENTS OF THIS INVENTION

Figure 1:
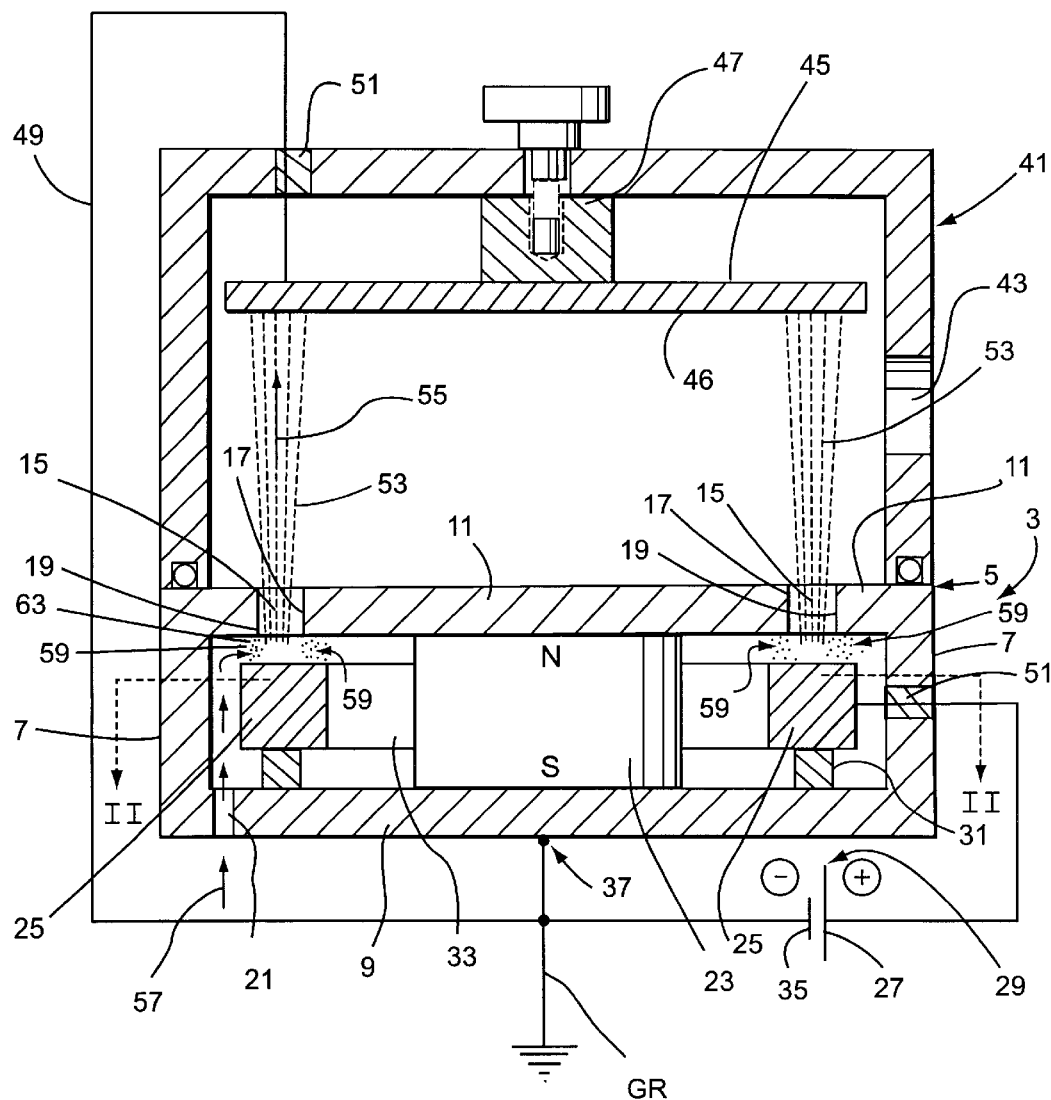
FIG. 1 is a schematic partial cross-sectional view of a conventional cold cathode closed drift ion source.

In the following description, for purposes of explanation and not limitation, specific details are set forth in order to provide an understanding of certain embodiments of the present invention. However, it will apparent to those skilled in the art that the present invention may be practiced in other embodiments that depart from these specific details. In other instances, detailed descriptions of well known devices, gases, fasteners, and other components/systems are omitted so as to not obscure the description of the present invention with unnecessary detail. Referring now more particularly to the accompanying drawings, in which like reference numerals indicate like parts/elements/components/areas throughout the several views.

Figure 2:
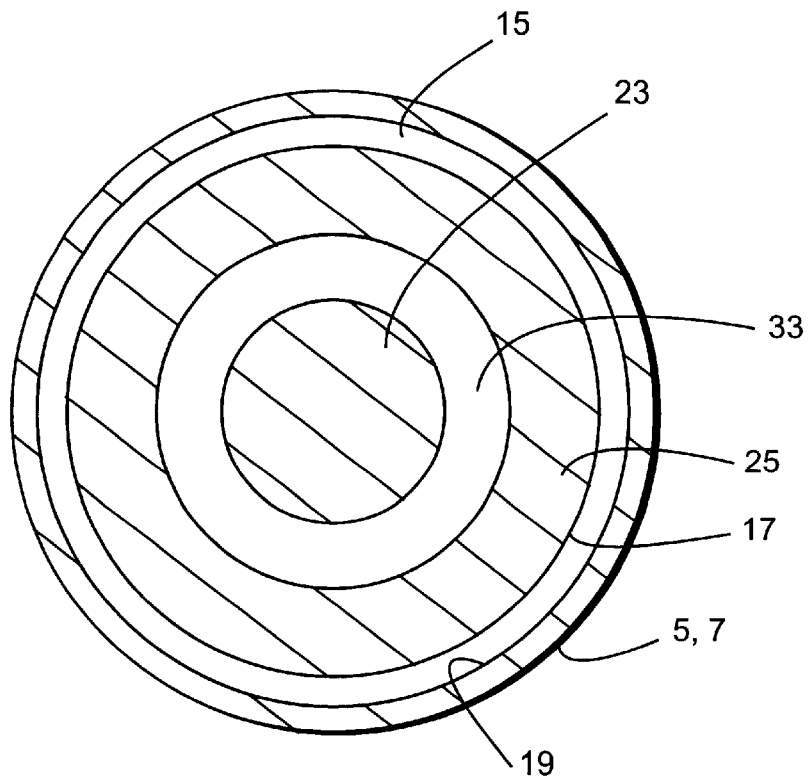
FIG. 2 is a sectional view taking along section line II of FIG. 1.
Figure 3:
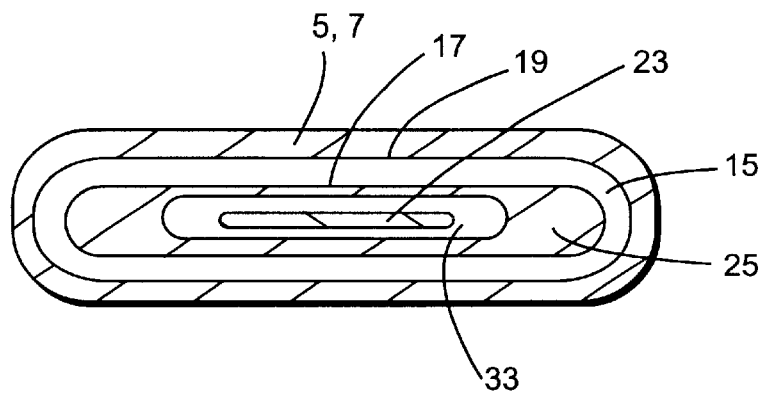
FIG. 3 is a sectional view similar to that of FIG. 2 along section line II, illustrating that the ion source of FIG. 1 may be shaped in an oval manner as opposed to a cylindrical or circular manner.
Figure 4:
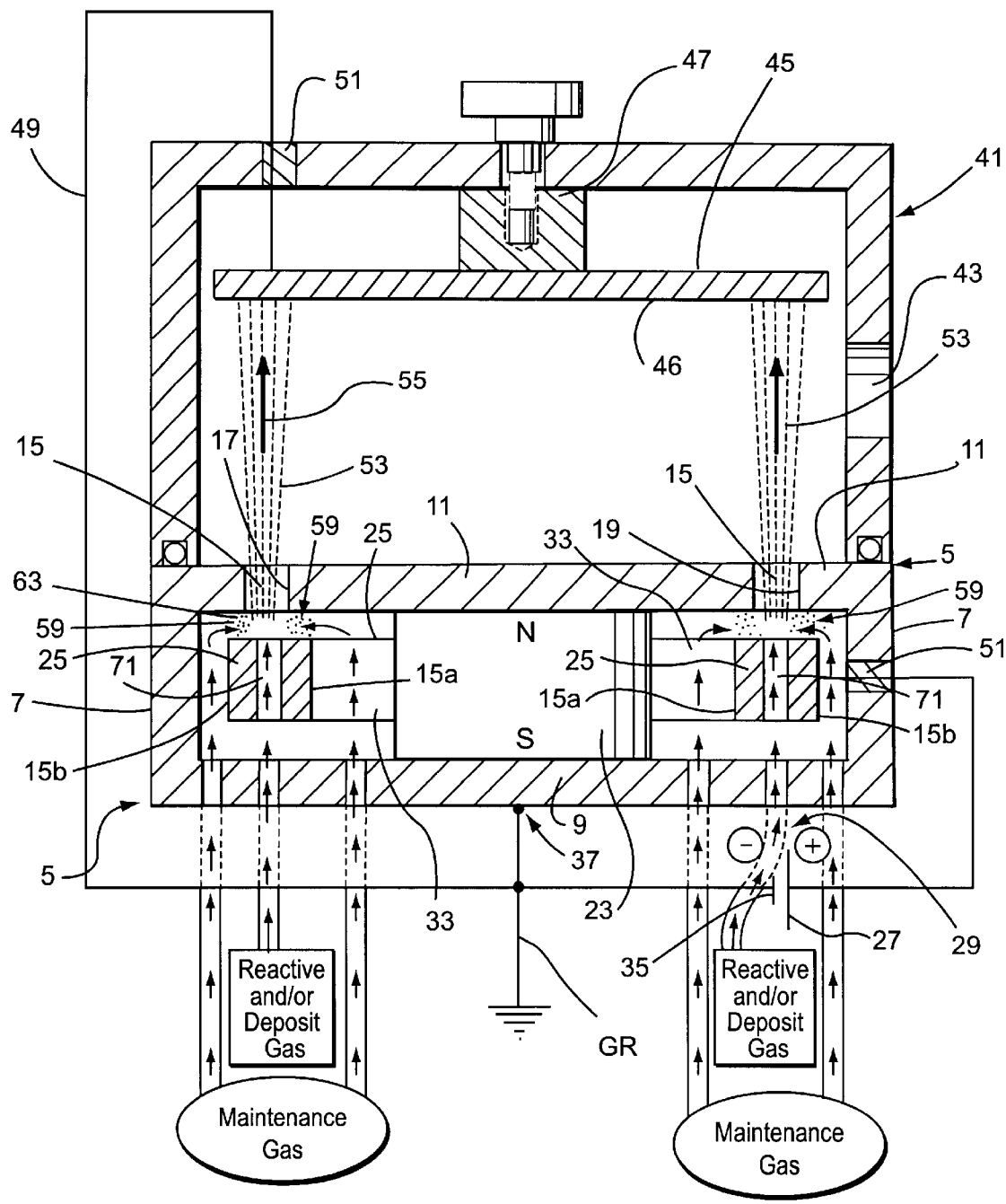
FIG. 4 is a schematic and partial sectional view of a cold cathode closed drift ion source with segregated gas flow according to an embodiment of this invention.

FIG. 4 is a schematic and partial sectional view of an ion source according to an exemplary embodiment of this invention. The cold cathode closed drift type ion source of FIG. 4 is similar in many respects to that of FIGS. 1–3. Closed loop ion emitting slit 15 may be circular, cylindrical, rectangular, triangular, elliptical, or oval in shape according to different embodiments of this invention. Shapes herein are for purposes of example only, and are not intended to be limiting.

The terms "aperture", "channel" and "slit" are used herein for purposes of convenience are not intended to be limited as to shape or size. For example, an aperture herein may be of any shape or size (e.g., circular, rectangular, triangular, semi-circular, trapezoidal, channel-shaped, slit-shaped, or the like). Thus, a "slit" may be both a slit as well as an aperture herein, as may a channel. Likewise, the term "aperture" as used herein includes simple holes as well as apertures in the form of slit, channels, and the like.

The cold cathode closed drift ion source of FIG. 4 may be utilized in order to ionize gas molecules and then focus them and cause them to be accelerated and emitted as a beam 53 toward a substrate 45. This ion beam may be utilized for various technical and technological purposes, including but not limited to, cleaning the substrate, activating something on the substrate, polishing the substrate, etching a portion of the substrate, and/or depositing a thin film coating(s) and/or layer(s) on the substrate.

Anode 25 includes a body or main body defining an inner periphery 15a and an outer periphery 15b. Thus, within the main body of the anode 25 is an aperture in which magnet 23 is located. The body of anode 25 includes gas inlet aperture 71 defined therein. The inner and outer peripheries of the anode 25 may be circular, oval, elliptical, triangular, rectangular, or otherwise shaped in different embodiments of this invention. The inner and outer peripheries of the anode 25 may be concentric in certain embodiments, and non-concentric in other embodiments of this invention.

Figure 5:
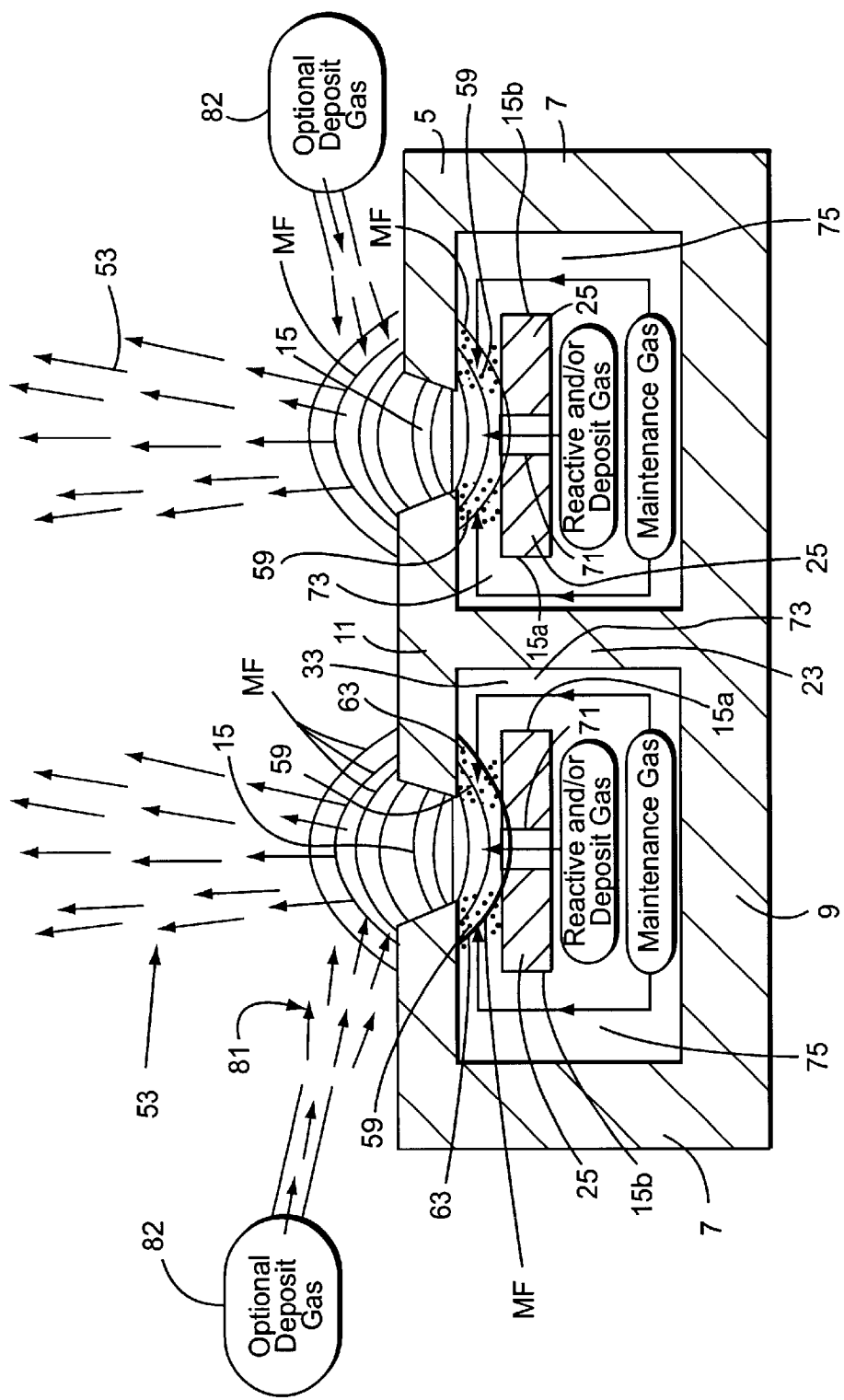
FIG. 5 is a schematic and partial sectional view of certain portions of the ion source of FIG. 4.
Figure 7:
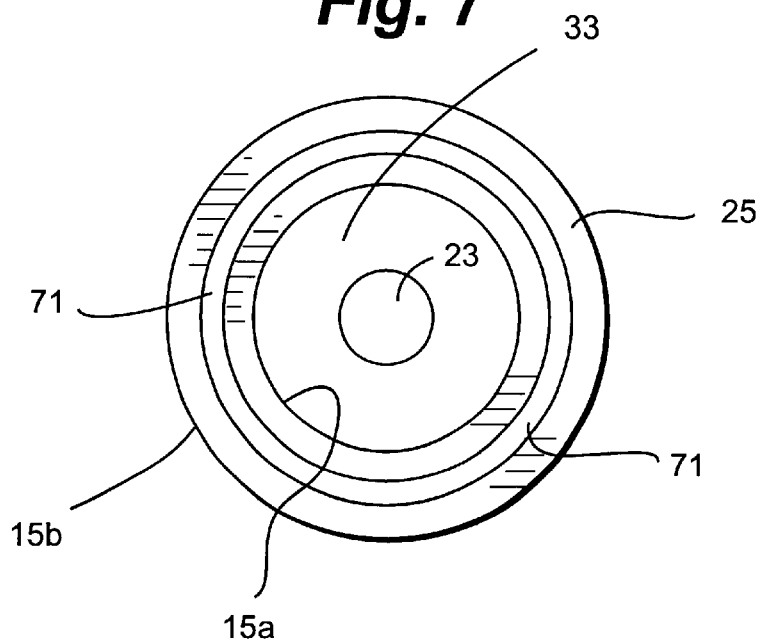
FIG. 7 is a top view of the anode and magnet of the FIG. 4-5 embodiment of this invention.

Referring to FIGS. 4–5 and 7, in certain exemplary embodiments of this invention anode 25 is at a positive potential and cathode 5 is either at a grounded or negative potential. This causes active electrons to pass through electrical gap 63 between anode 25 and cathode 5. Magnetic field (MF) caused at least in part by magnet 23 proximate slit 15 tends to keep the active electrons proximate the slit so that they can ionize gas in the vicinity of the slit. Gas molecules and/or atoms flowing proximate slit 15 (some of which may flow through electric gap 63) are thus bombarded by electrons 59 and ionized in a known manner. Because of at least the potential of anode 25, the ions are propelled (i.e., accelerated) outwardly from slit 15 in the form of a beam 53 toward substrate 45. Substrate 45 may be grounded as shown in FIG. 4 according to certain embodiments of this invention. In other embodiments of this invention, substrate 45 need not be grounded.

The particular magnetic circuit illustrated in the drawings is for purposes of example only, and clearly is not intended to be limiting. The magnet may be positioned as illustrated within the circumference of anode 25, or instead it may be provided at other locations in order to produce the transverse magnetic field in slit 15. In other words, there are many different ways of producing the transverse field in slit 15. For example, as an alternative to the illustrated embodiments, cylindrical magnets could be embedded in the outer cylindrical housing with all or most of the cylindrical magnets having polarities oriented in approximately the same direction and aligned along the axis of the ion source. Then, the central magnet could be replaced with magneto-conductive material, and a closed circuit (with no or minimal gaps) that connects to both surfaces defining slit 15 is till obtained.

In accordance with different embodiments of this invention, different gases are caused to flow toward slit 15 by way of different flow paths. This is done in order to reduce the likelihood of insulative material buildup in electric gap 63 and/or to render the ion source more efficient in nature.

Referring to FIGS. 4–5, it is possible to utilize two, three or more different types of gas in the source according to different embodiments of this invention. These gases include maintenance gas, chemically reactive gas, and/or depositing gas, or any combination thereof.

In general, depositing gas (e.g., silane, siloxane, acetylene, etc.) is utilized whenever it is desired to deposit a thin film coating or layer(s) on surface 46 of substrate 45 where the coating is to include material from the depositing gas. In such a case, molecules of the depositing gas are ionized proximate slit 15 by the active electrons which are contained throughout much of the magnetic field (MF). These ions from the depositing gas are then accelerated outwardly as at least part of beam 53 toward the substrate and are deposited on surface 46 thereof. In such a manner, thin films may be deposited on substrate 45, such as diamond-like carbon (DLC) thin films, and the like. Exemplary depositing gases (e.g., $C_2H_2$ and/or TMS) which may be used to deposit DLC and other materials on a substrate are disclosed along with the resulting thin film coatings in U.S. Ser. Nos. 09/303,548, filed May 3, 1999, and 09/442,805, filed Nov. 18, 1999, the disclosures of which are both hereby incorporated herein by reference.

As illustrated in FIG. 5, depositing gas may flow toward slit 15 through flow path or aperture 71 defined in an otherwise solid portion of the body of anode 25. The location of gas flow aperture or path 71 immediately beneath slit 15 enables the depositing gas (which often includes insulative components such as silicon (Si)) to flow directly into slit 15 without much of the gas having to pass through the electrical gap 63 between anode 25 and cathode 5. Thus, in certain embodiments of this invention, preferably less than 50% of the depositing gas passes through electrical gap 63, more preferably less than about 30%, and most preferably less than about 20%). By reducing the amount of depositing gas (e.g., a hydrocarbon or organosilicon gas that results in buildup of insulative material in the electrical gap 63) that flows through the electrical gap 63 between the anode and cathode, the tendency of insulative material(s) from the depositing gas to build up on the anode and/or cathode in the area of electric gap 63 is reduced. Thus, electrical characteristics of gap 63 can be maintained in a more efficient and easy manner.

Once the molecules of the depositing gas have flowed through flow channel or aperture 71 in anode 25 and reached the MF area proximate slit 15, they are bombarded by active electrons located in the MF proximate the slit and ionized so that they are expelled as at least part of ion beam 53 toward substrate 45 (e.g., so that a thin film coating(s) can be deposited on the substrate; where the chemical make-up of such a coating(s) depends on the type of gas(es) used).

Maintenance gas (e.g., argon, krypton or xenon) may be utilized in combination with depositing gas in certain embodiments of this invention. However, as illustrated in FIGS. 4 and 5, all of the maintenance gas need not flow through the same channel or aperture 71 as the depositing gas. Instead, much of the maintenance gas (e.g., all of the maintenance gas in certain embodiments; or even only a portion of maintenance gas in other embodiments) flows around the inner and/or outer periphery(ies) 15a and/or 15b of the anode 25 and through one or more of the respective electrical gap(s) 63 between the anode 25 and cathode 5, before reaching slit 15. As shown in FIGS. 4–5, maintenance gas may flow through one or both of respective channels or flow paths 73, 75 around the inner and/or outer periphery (ies) of anode 25. The provision of this maintenance gas in the electric gap 63 between the anode and cathode defines much of the electrical performance of the ion source (i.e., the maintenance gas is the fuel which runs the plasma generated in the vicinity of the slit). For example, the flow rate of the maintenance gas within electric gap(s) 63 determines certain electrical characteristics, e.g., voltage and/or current between the anode/cathode. Depending upon the plasma in the gap(s) 63, the current in the gap is translated into a beam current, i.e., a flux of ions expelled outwardly in beam 53 toward the substrate. The higher the current in the gap, the greater the ion flux. Thus, it is important to control the amount of gas in respective electric gap(s) 63. As discussed above, control of the amounts of gas in gaps 63 may be achieved in part by reducing the likelihood of the buildup of insulative material in gaps 63 which may reduce the flow of maintenance gas therethrough. Moreover, it will be appreciated by those skilled in the art that the depositing gas may be changed without having to change the maintenance gas in certain embodiments of this invention, so that the type of coating/layer being deposited on substrate can be changed without having to change significant electrical characteristics of the beam and/or gap.

Accordingly, it can be seen that in many embodiments it may be desirable to utilize a first gas as a depositing gas(es) (e.g., silane, siloxane, silazane, cyclohexane, acetylene, etc.) which produces substantial insulative deposits (e.g., SiC); and a second gas(es) (e.g., argon, xenon, krypton, etc.) as a maintenance gas which will not typically cause much material buildup on the anode or cathode in gap(s) 63. Thus, the non-insulative maintenance gas passed through one or more of channels or paths 73, 75 may be utilized to control and/or determine the electrical characteristics of ion beam 53, while the depositing gas injected through flow path or aperture 71 within the anode itself may be utilized to determine which ions are to be expelled in beam 53 for deposition on the surface of substrate 45 (it is noted that in certain embodiments of this invention all maintenance gas flows through channels 73 and/or 75 and none through channel 71; while in other embodiments of this invention dome maintenance gas may flow through 71 and/or a portion of depositing gas may flow through channel(s) 73, 75 in addition to channel 71). Thus, in certain embodiments of this invention the depositing gas may be changed and/or adjusted with relative frequency, without having to worry about adversely affecting or undesirably changing the electrical characteristics (e.g., ion energy) of the beam 53.

In short, by injecting the depositing gas through a central portion the body of anode 25 (i.e., between the inner and outer peripheries 15a and 15b, respectively, of the anode) beneath slit 15 so that much of the depositing gas does not have to pass through the direct electrical gap(s) 63 between the anode and cathode, less insulative material deposition on the anode and/or cathode occurs in gap(s) 63. Moreover, when it is desired to change the material for a coating and/or layer being deposited on substrate 45, the depositing gas can be changed without unduly altering the electrical characteristics of the ion beam 53 (because the maintenance gas need not be changed). Thus, changes in beam 53 chemistry can be achieved without unduly altering the characteristics of the beam itself.

The reduction of insulative material buildup in gaps 63 is of particular importance when producing insulating coatings, such as silicon inclusive diamond-like carbon layers/coatings which are highly electrically insulating. Such insulative deposits on the anode and/or cathode in gap(s) 63 can disrupt and/or terminate the inter-electrode plasma (the plasma which generates the beam ions) between the anode and cathode.

As discussed above, the ion source of FIGS. 4–5 and 7 may be utilized for purposes other than deposition of coatings and/or layers on substrate 45. For example, the ion source of FIGS. 4–5 and 7 may be utilized to direct an ion beam 53 toward substrate 45 in order to etch a portion of the substrate (e.g., glass or plastic substrate), or alternatively may be used to clean a surface of the substrate.

In exemplary etching embodiments of this invention, a chemically reactive gas may be utilized and injected through flow path 71 instead of the aforesaid depositing gas. For example, if it is desired to use the ion source to etch a substrate 45 of plastic material, a maintenance gas of argon may be used in combination with a reactive gas of oxygen. The oxygen would be passed through flow channel 71 in the body of the anode (surrounding the magnet), while the argon would be injected through one or both of flow paths 73, 75 around the inner and outer peripheries of the anode 25. Thus, the oxygen and argon ions mix in the area of slit 15, but many of the oxygen ions which were injected through aperture 71 would not have passed through electric gap(s) 63. The mixture of oxygen and argon are ionized by electrons in the MF, and these ions are expelled toward the plastic substrate in beam 53. The oxygen ions of the beam react with the plastic surface of the substrate in order to etch the same. In other embodiments where it is desired to etch the surface of a substrate 45 of glass, argon maintenance gas may be utilized in combination with $CF_4$ and/or $O_2$ reactive gases. In other words, either a depositing gas or a non-depositing reactive gas may be injected through aperture 71 directly into slit 15 (in combination with maintenance gases) in different embodiments of this invention.

As shown in FIG. 5, it is also possible to direct depositing gas at 81 toward the MF proximate slit 15 from a position above top wall 11 of the cathode, such that top wall 11 is located between this optional source(s) 82 and anode 25. Introducing depositing gas at 81 above the top wall 11 may be used either in combination with injecting depositing gas through aperture 71, or instead of introducing depositing gas through aperture 71. In still further embodiments, the depositing gas being introduced at 81 may be used in combination with both a maintenance gas introduced at 73, 75 and/or reactive gas introduced through channel 71.

When using source(s) 82, the depositing gas introduced at 81 is directed toward MF where active electrons are present. These reactive electrons ionize the depositing gas so that the ions thereof may be expelled from the vicinity of slit 15 as at least part of beam 53 toward substrate 45 so that they can be deposited on surface 46.

The embodiment of FIGS. 4–5 and 7 (see especially FIG. 7) illustrates a single gas flow aperture or slit 71 that is provided in the body of the anode around the entire periphery of the magnet 23. In other words, aperture or slit 71 may be shaped in the form of a racetrack, a circle, an oval, a rectangle, an ellipse, or a triangle surrounding the magnet much like the shape of slit 15 (i.e., aperture/slit 71 is continuous in nature and surrounds the magnet when viewed from above as in FIG. 7). However, in other embodiments of this invention, aperture 71 need not be continuous and need not surround the magnet.

Figure 8:
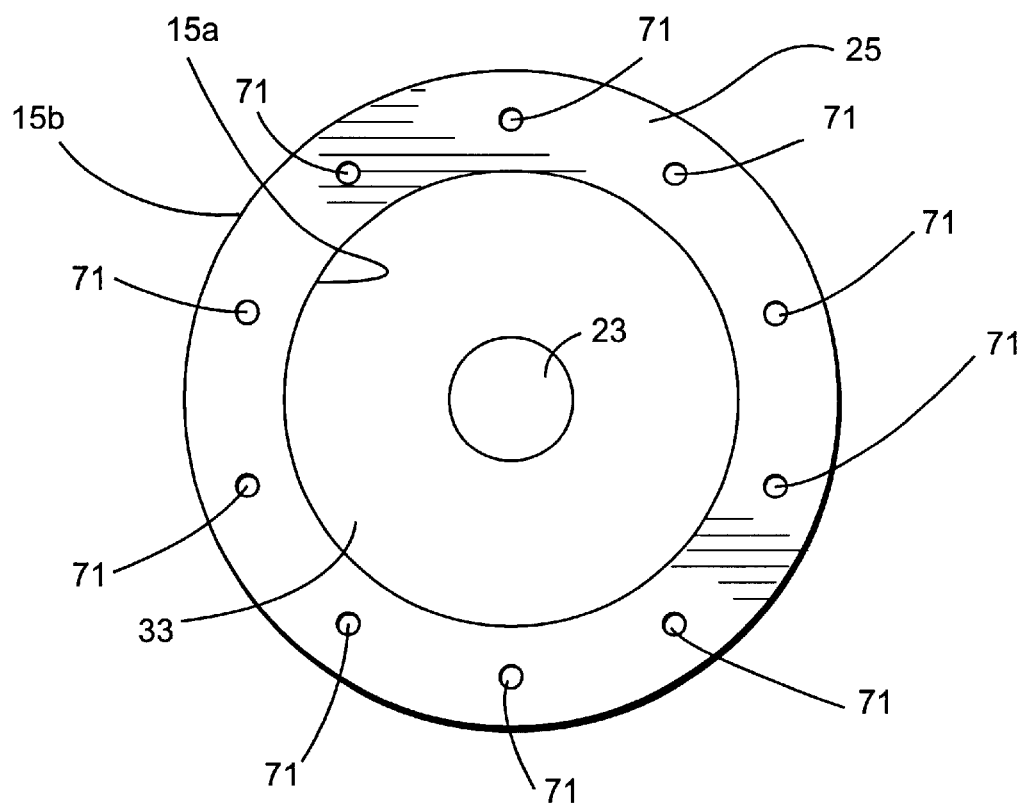
FIG. 8 is a top view of the anode and magnet of another embodiment of this invention, illustrating that a plurality of different flow passages may be provided within the body of the anode.

For example, refer to the embodiment of FIG. 8 where instead of a single continuous aperture 71 surrounding the magnet 23, a plurality of different and spaced apart gas flow apertures 71 are provided in the body of the anode 25 between the inner and outer anode peripheries. Each of the plurality of different flow apertures 71 in the FIG. 8 embodiment may be in the shape of a circle as shown, or alternatively may be shaped as rectangles, triangles, short slits, curved slits, ovals, ellipses, or the like. Two, three, four, five, six, seven, eight, nine, ten (as illustrated in FIG. 8), eleven, or more such apertures 71 may be provided in the body of the anode 25 for gas flow purposes in different embodiments of this invention. Depositing and/or reactive gas(es) may be passed through one or more of apertures 71 in the same manner as discussed above, toward slit 15 so as to attain advantages discussed herein.

Figure 6:
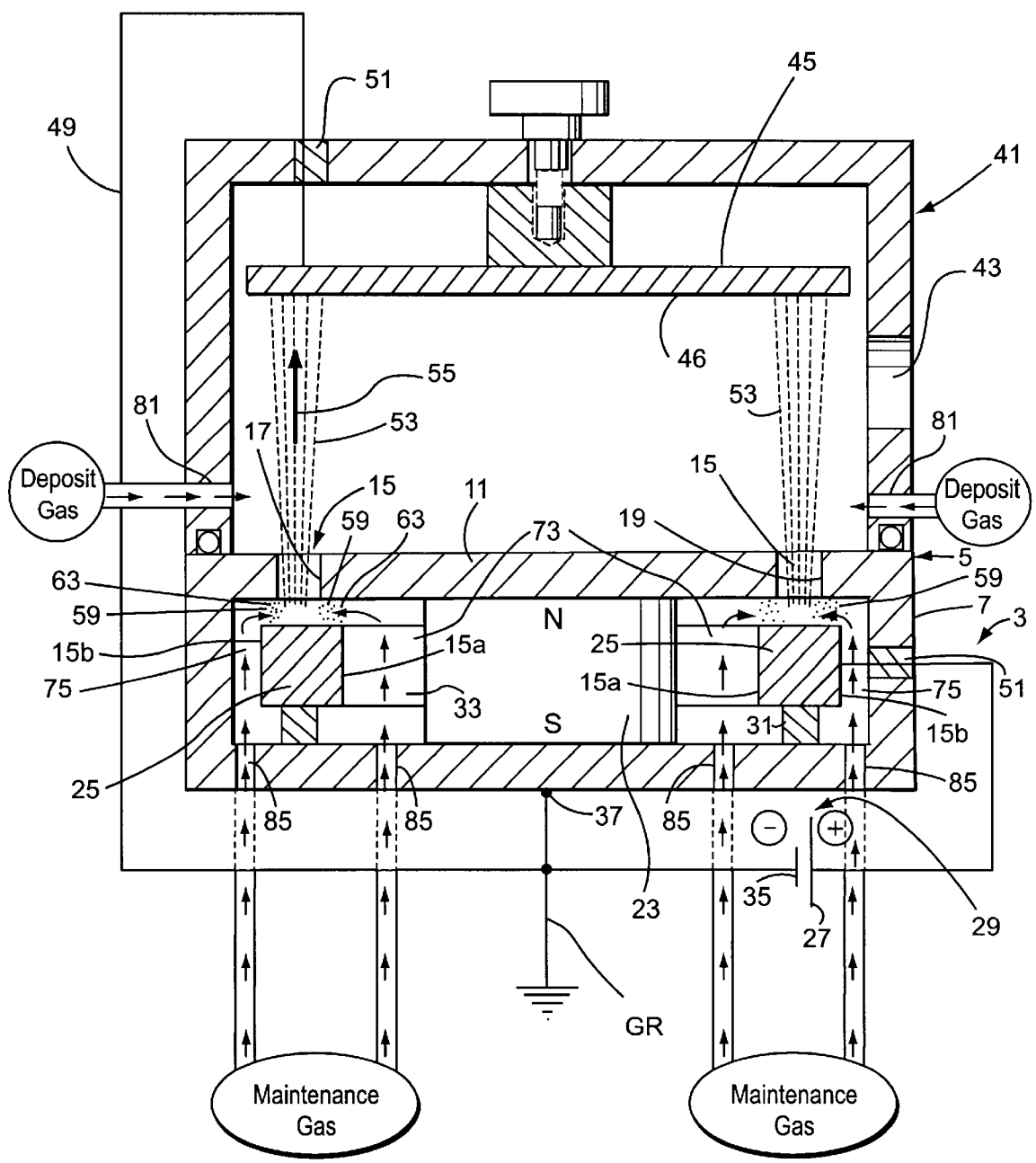
FIG. 6 is a schematic and partial sectional view of a cold cathode closed drift ion source with segregated gas flow according to another embodiment of this invention.

FIG. 6 illustrates another embodiment of this invention. In the FIG. 6 embodiment, maintenance gas (as described above) is injected through gas flow paths or channels 85 so that the maintenance gas flows through one or more of channels 73, 75 around the inner and outer peripheries of anode 25, respectively, toward slit 15. In the FIG. 6 embodiment, there is no aperture or hole in the anode for injecting a depositing and/or reactive gas. Thus, for example, depositing gas may be injected at a location 81 through at least one flow path or channel in the side of vacuum chamber 41 above top cathode wall 11. The depositing gas is directed toward the magnetic field (MF) proximate slit 15, so that the depositing gas molecules can be ionized and the resulting ions expelled toward substrate 45 in beam 53. Again, it is beneficial, especially in the case of depositing gases including insulative materials such as silicon, to introduce the depositing gas at a location such as that in FIG. 6 so that much of the depositing gas does not have to pass through the electric gap(s) 63 between the anode and cathode. This reduces the potential of insulative material buildups on the anode and/or cathode in electric gap(s) 63 as discussed above.

Once given the above disclosure, many other features, modifications, and improvements will become apparent to the skilled artisan. Such other features, modifications, and improvements are therefore considered to be a part of this invention, the scope of which is to be determined by the following claims and equivalents thereof.

What is claimed is:

1. An ion beam source with a closed loop ion emitting slit capable of emitting an ion beam toward a substrate, the ion beam source comprising:

a hollow cathode;

an anode located at least partially in a portion of said hollow cathode and spaced from said cathode in a manner so as to form an electrical gap between said anode and said cathode through which electrons flow, said anode including an inner periphery and an outer periphery;

at least one magnet for generating a magnetic field proximate a closed loop slit formed in said cathode, wherein an ion beam is emitted toward a substrate from an area in or proximate said slit;

a first gas flow aperture or channel located adjacent a periphery of said anode for enabling a first gas to flow around the periphery of the anode and through said electrical gap toward said slit; and at least one second gas flow channel or aperture located within a body of said anode between said inner and outer peripheries of said anode, said at least one second gas flow channel or aperture for enabling a second gas to flow through said second gas flow channel or aperture toward said slit such that at least a portion of the second gas flowing through said second gas flow channel or aperture reaches said closed loop slit without having to pass through said electrical gap between said anode and said cathode.

2. The ion beam source of claim 1, wherein said second gas flow channel or aperture comprises a continuous aperture which surrounds said magnet that is encompassed by said inner periphery of said anode.

3. The ion beam source of claim 1, further comprising a plurality of spaced apart ones of said second gas flow channels or apertures located within the body of said anode for enabling the second gas to flow through said plurality of second gas flow channels or apertures toward said slit, wherein said plurality of spaced apart ones of said second gas flow channels or apertures are located within said anode such that at least a portion of the second gas flowing through said plurality of spaced apart ones of said second gas flow channels or apertures reaches said slit without having to pass through said electrical gap between said anode and said cathode.

4. The ion beam source of claim 1, wherein said first gas comprises an inert gas and said second gas comprises a depositing gas which produces an insulative material.

5. The ion beam source of claim 4, wherein said insulative material produced by said second gas includes silicon (Si).

6. The ion beam source of claim 1, wherein each of said slit, said first gas flow aperture or channel, and said second gas flow aperture or channel is closed-loop in shape.

7. The ion beam source of claim 6, wherein each of said slit, said first gas flow aperture or channel, and said second gas flow aperture or channel is closed-loop in shape and surrounds said magnet when viewed from above.

8. The ion beam source of claim 1, wherein said cathode is a cold cathode.

9. The ion beam source of claim 1, wherein said cathode comprises a bottom wall and a top wall; and wherein another gas source is provided for directing a depositing gas toward a magnetic field (MF) proximate said slit via at least one gas flow aperture or channel located at a position such that said top wall of said cathode is at least partially located between said at least one gas flow aperture or channel and a portion of said anode, so that the first gas and said depositing gas from said another source are directed toward the magnetic field (MF) proximate said slit from opposite sides of said top wall of said cathode.

10. The ion beam source of claim 1, wherein said anode is maintained at an electrical charge that is positive relative to an electrical charge at which said cathode is maintained.

11. An ion beam source capable of emitting an ion beam toward a substrate, the ion beam source comprising:

a cathode;

an anode located at least partially between respective portions of said cathode, said anode including an inner periphery and an outer periphery;

an electrical gap defined between said anode and said cathode;

at least one magnet for generating a magnetic field proximate an ion emitting aperture defined in said cathode, wherein an ion beam is emitted toward a substrate from an area in or proximate said ion emitting aperture;

at least one first gas flow aperture or channel for enabling a first gas to flow around a periphery of the anode and through said electrical gap toward said ion emitting aperture; and at least one second gas flow channel or aperture located within a body of said anode between inner and outer peripheries of said anode, said second gas flow channel or aperture for enabling a second gas to flow through said second gas flow channel or aperture toward said ion emitting aperture.

12. The ion beam source of claim 11, wherein said second gas flow channel or aperture is located at a position within said anode such that much of the second gas flowing through said second gas flow channel or aperture reaches said slit without having to pass through said electrical gap between said anode and said cathode.

13. A method of emitting an ion beam toward a substrate, the method comprising the steps of:

providing an ion beam source including an anode and a cathode, so that an electrical gap is provided between the anode and cathode;

causing a first gas to flow through a first flow area around a periphery of the anode and through the electrical gap toward an aperture defined in the cathode;

causing a second gas to flow through a second gas flow channel or aperture defined in a body of the anode and toward the aperture in the cathode; and ionizing at least a portion of at least one of the first and second gases proximate the aperture in the cathode and causing an ion beam to be directed from the aperture in the cathode toward the substrate.

14. The method of claim 13, wherein the second gas flow channel or aperture is located in the anode between an inner periphery of the anode and an outer periphery of the anode.

15. The method of claim 13, further comprising the steps of:

causing an inert gas to flow through the first flow area around a periphery of the anode and through the electrical gap toward the aperture defined in the cathode;

causing a depositing gas, including more insulative element material than the first gas, to flow through the second gas flow channel or aperture defined in the body of the anode and toward the aperture in the cathode; and ionizing at least a portion of the depositing gas proximate the aperture in the cathode and causing an ion beam to be directed from the aperture in the cathode toward the substrate.

16. An ion beam source capable of emitting an ion beam toward a substrate, the ion beam source comprising:

an anode and a cathode, with an electrical gap defined between said anode and said cathode;

at least one first gas flow aperture or channel for enabling a first gas to flow through said electrical gap toward an aperture in said cathode; and at least one second gas flow channel or aperture for enabling a second gas to flow through said second gas flow channel or aperture toward said aperture without much of the second gas having to flow through said electrical gap.

* * * * *